United States Patent
Lakdawala et al.

(10) Patent No.: US 7,212,141 B2
(45) Date of Patent: May 1, 2007

(54) FILTER WITH GAIN

(75) Inventors: Hasnain Lakdawala, Beaverton, OR (US); Ashoke Ravi, Hillsboro, OR (US); Georgios Palaskas, Portland, OR (US); Stefan H. Andersson, Linkoping (SE); Krishnamurthy Soumyanath, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/178,625

(22) Filed: Jul. 11, 2005

(65) Prior Publication Data

US 2007/0008208 A1 Jan. 11, 2007

(51) Int. Cl.
*H03M 1/84* (2006.01)
*H03M 1/62* (2006.01)

(52) U.S. Cl. ...................................... 341/139
(58) Field of Classification Search ................ 341/143, 341/172, 139, 155; 455/315, 232.1; 375/346, 375/260
See application file for complete search history.

(56) References Cited

U.S. PATENT DOCUMENTS

| | | | | |
|---|---|---|---|---|
| 5,289,059 | A | * | 2/1994 | Pikkarainen ................. 327/552 |
| 5,724,653 | A | * | 3/1998 | Baker et al. ................. 455/296 |
| 7,003,276 | B2 | * | 2/2006 | Muhammad et al. ........ 455/323 |
| 2002/0110189 | A1 | * | 8/2002 | Souissi et al. .............. 375/235 |
| 2004/0063418 | A1 | * | 4/2004 | Kluge et al. ................ 455/315 |
| 2005/0025270 | A1 | * | 2/2005 | Muhammad et al. ........ 375/346 |
| 2005/0104654 | A1 | * | 5/2005 | Muhammad et al. ........ 327/552 |

OTHER PUBLICATIONS

Ranganathan, Sanjeev, et al., "Discrete-Time Parametic Amplification Based on a Three-Terminal MOS Varactor: Analysis and Experimental Results", *IEEE Journal of Solid-State Circuits*, vol. 38, (Dec. 2003),2087-2093

Chen, Feng, et al., "A 0.25mW 13b Passive Modulator for a 10MHz IF Input", *IEEE International Solid-State Circuits Conference*, (1996),3 pages, no month.

* cited by examiner

*Primary Examiner*—Peguy JeanPierre
(74) *Attorney, Agent, or Firm*—Lee and Hayes, PLLC

(57) ABSTRACT

Embodiments of a filter with gain are presented herein.

17 Claims, 8 Drawing Sheets

US 7,212,141 B2

FILTER WITH GAIN

BACKGROUND

A variety of wireless devices may employ wireless radios to provide wireless communication, one to another, such as computers, wireless phones, wireless routers, and so on. In some of these devices, conversion from analog to digital is utilized to process the signal for communication, generally through use of an analog/digital converter (A/D converter). Aliasing may be encountered, however, when performing analog/digital conversion, which may result in out-of-band signals. These out-of-band signals may have a negative impact on the signal and even render the signal unusable for its intended purpose.

One technique that may be utilized for translation and filtering is through use of anti-aliasing filters. However, traditional anti-aliasing filters may be difficult to derive, especially if gain to the signal is required. For example, an analog signal may be received by a radio. The radio may convert the analog signal to a digital signal, as well as provide gain to the signal for further processing. However, the gain may interfere with anti-aliasing of the signal. This interference may thereby decrease the amount of gain available when filtering the signal.

BRIEF DESCRIPTION OF THE DRAWINGS

The same reference numbers are utilized in instances in the discussion to reference like structures and components.

DETAILED DESCRIPTION

In the following discussion, exemplary devices are described which may provide and/or utilize a filter with gain. Exemplary procedures are then described which may be employed by the exemplary devices, as well as by other devices without departing from the spirit and scope thereof.

EXEMPLARY DEVICES

Figure 1:
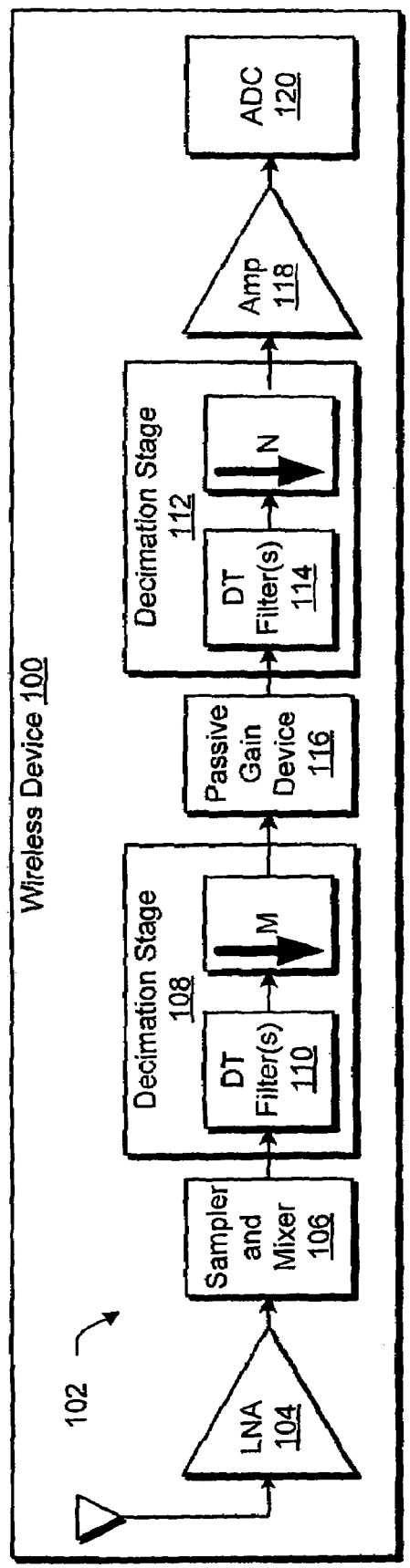
FIG. 1 is an illustration of a portion of an exemplary data radio that is operable to employ a filter with gain.

FIG. 1 illustrates an exemplary wireless device 100 that is operable to employ a filter with gain. The wireless device 100 may be configured in a variety of ways. For example, the wireless device 100 may be configured as a wireless router, a wireless integrated circuit, a wireless laptop which employs the wireless integrated circuit, a wireless phone, a wireless peripheral device, and so on.

The wireless device 100 is illustrated as including components of a radio 102 that in this exemplary embodiment are configured to communicate data. The radio 102 provides analog frequency translation and filtering through use of a "sampled data receiver". For instance, the radio, through use of a sampled data receiver, may convert a signal at discrete voltage steps at radio frequencies (RF), that is significantly higher than the frequency used to digitize the message signal. The sampled signal may be filtered and decimated in one or several steps, followed by digital to analog conversion.

As illustrated, the wireless device 100 may receive an input at a low-noise amplifier (LNA) 104. The LNA 104 provides an output to a sampler and mixer 106 which is configured to sample the signal amplified by the LNA 104. The sampler and mixer 106 provide this output to a decimation stage 108 to decimate the sampled signal.

The decimation stage 108 may be configured in a variety of ways. For example, the decimation stage 108 may employ a combination of discrete time (DT) filters 110. The DT filters 110 may be utilized to avoid noise aliasing during the decimation process and to achieve filtering of in-band blockers. The DT filters 110 may be implemented in a variety of ways, such as a Fast Fourier Transform (FFT) filter, Infinite Impulse Response (IIR) filter, and so on. For instance, the DT filters 110 may be implemented using switched capacitors, further discussion of which may be found in relation to FIG. 2.

For high sampling rates, the decimation ratio is generally relatively large and therefore may be performed in stages. For example, as illustrated in the wireless device 100 of FIG. 1, the radio 102 may employ another decimation stage 112 to further decimate and filter the signal obtained from a previous decimation stage, e.g., decimation stage 108. The decimation stage 112 is also illustrated as including one or more DT filters 114, which may be the same as or different from the DT filters of decimation stage 108. Although a plurality of two decimation stages 108, 112 are illustrated for the radio 102 of FIG. 1 a wide range of decimation stages may be provided, such as from one to "X", where "X" is any integer utilized to achieve a desired result by a designer of the radio. Further, it should be noted that the decimation stages 108, 112 are illustrated as including respective boxes having respective letters "M" and "N" to illustrate a destination for the output of the respective DT filters 110, 114.

To provide gain, a passive gain device 116 may be employed, which may also provide sharp filter cut-off of a previous decimation stage, e.g., decimation stage 110. The passive gain device 116 in this instance is illustrated as positioned between the decimation stages 108, 112. Therefore, the passive gain device 116 may accept as an input a result of the decimation stage 108, provide gain to the input, and provide a result having the gain to the decimation stage 112 for further decimation and filtering. Although illustrated separately from the decimation stages 108, 112, the passive gain device 116 may also be incorporated within the decimation stages 108, 112, further discussion of which may be found in relation to FIG. 8.

After filtering and gain have been applied to the signal by the decimation stages 108, 112 and passive gain device 116, the signal may be passed to another amplifier 118 for further amplification. An output of the amplifier 118 is illustrated as then being provided to an analog/digital converter 120 for conversion to a digital representation.

Figure 2:
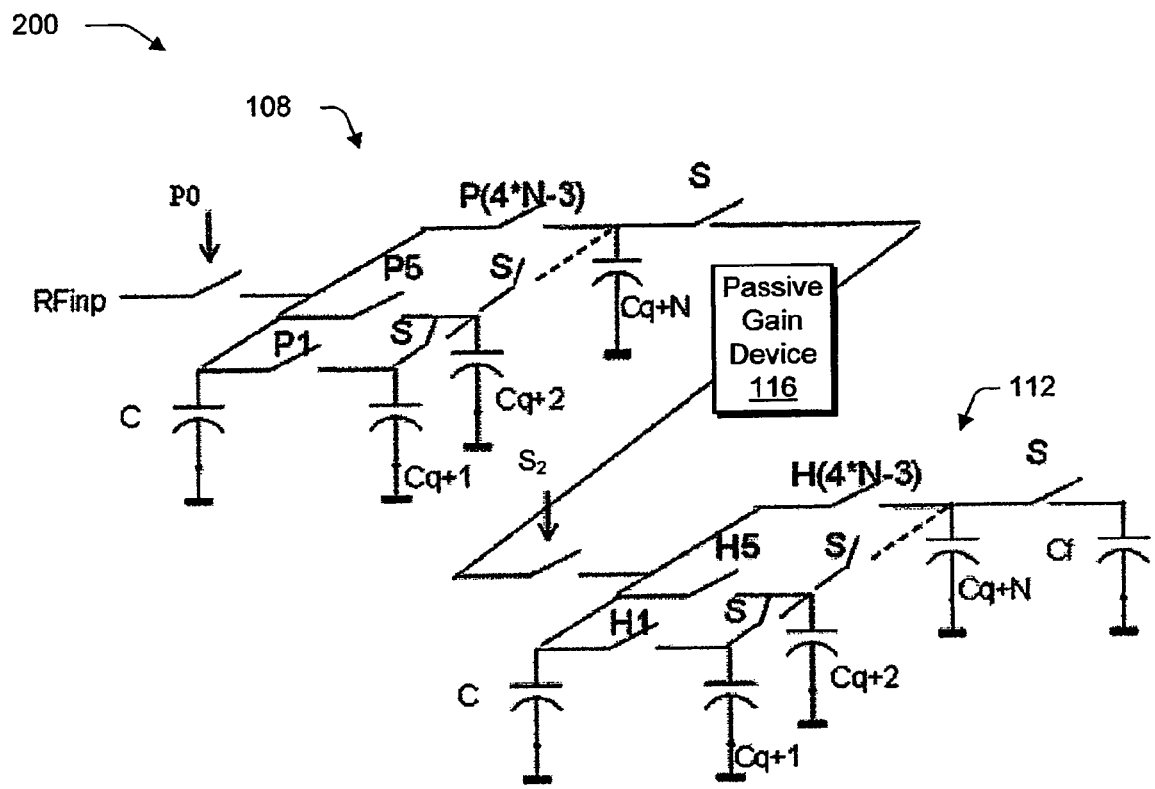
FIG. 2 is an illustration of a circuit in an exemplary implementation showing decimation stages and a passive gain device of the radio of FIG. 1 in greater detail.
Figure 3:
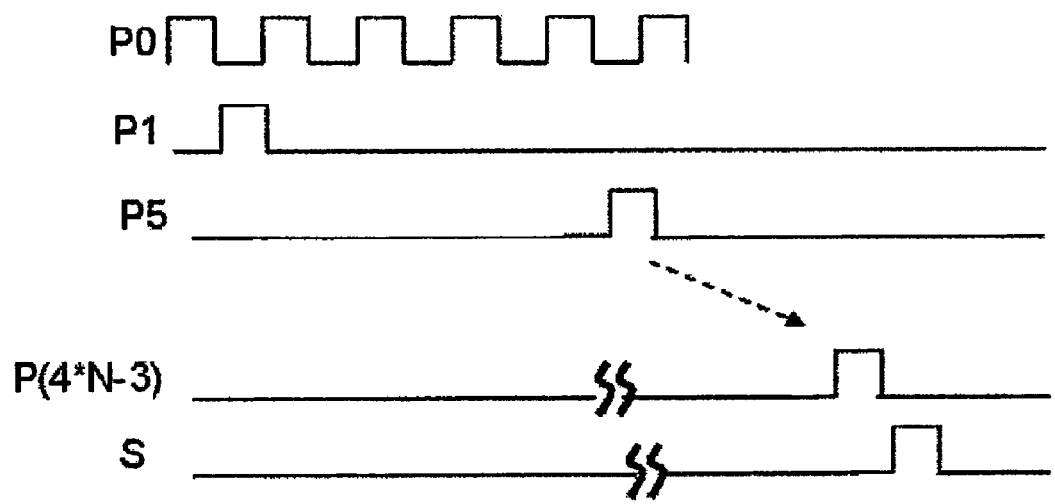
FIG. 3 is an illustration of a timing diagram which depicts charging of capacitors of a discrete time filter of FIG. 2.

FIG. 2 illustrates a circuit 200 and shows the decimation stages 108, 112 and passive gain device 116 of FIG. 1 in greater detail. Each of the decimation stages 108, 112 of FIG. 2 are illustrated as being implemented using a parametric amplifier approach. For example, decimation stage 108 is illustrated as including a FIR filter formed using plurality of capacitors. The plurality of capacitors are charged at different time slots to obtain a weighted average, a depiction of which may be found in the diagram 300 of FIG. 3. It should be noted that similar clocks to the P clocks may also be utilized without departing from the spirit and scope thereof. Likewise, decimation stage 112 is also illustrated as include a FIR filter formed using a plurality of capacitors that are suitable to obtain a weighted average through charging at different time slots in a manner similar to that shown in FIG. 3.

The illustrated decimation stages 108, 112, however, are passive and therefore do not provide gain to the signal by themselves. Therefore, the passive gain device 116 is illustrated as communicatively coupling the decimation stages 108, 112, one to another, to provide gain between the stages and therefore may be considered an "inter-stage passive gain device" in this example.

The passive gain device 116 may be implemented in a variety of ways. The passive gain device 116, for example, may exploit a charge conservation equation to provide gain to a signal. For instance, voltage $V_1$ may exist on a capacitor $C_1$, and therefore a total charge on the capacitor may be represented as follows:

$$Q = C_1 * V_1$$

When the capacitance is changed using an external technique from $C_1$ to $C_2$ (and such that no charge is lost) then the follow express holds true:

$$Q = C_2 * V_2 = C_1 * V_1$$

The above expression may then be rearranged as follows:

$$V_2 = (C_1/C_2) * V_1$$

Therefore, if $C_2 > C_1$, then $V_2 > V_1$ and thus a system employing the charge conservation equation provides gain. Accordingly, in an implementation the passive gain device 116 is configured as a variable capacitor to take advantage of the charge conservation equation, and thereby provide gain and IIR filtering between the decimation stages 108, 112, further discussion of which may be found in relation to the following figure.

Figure 4:
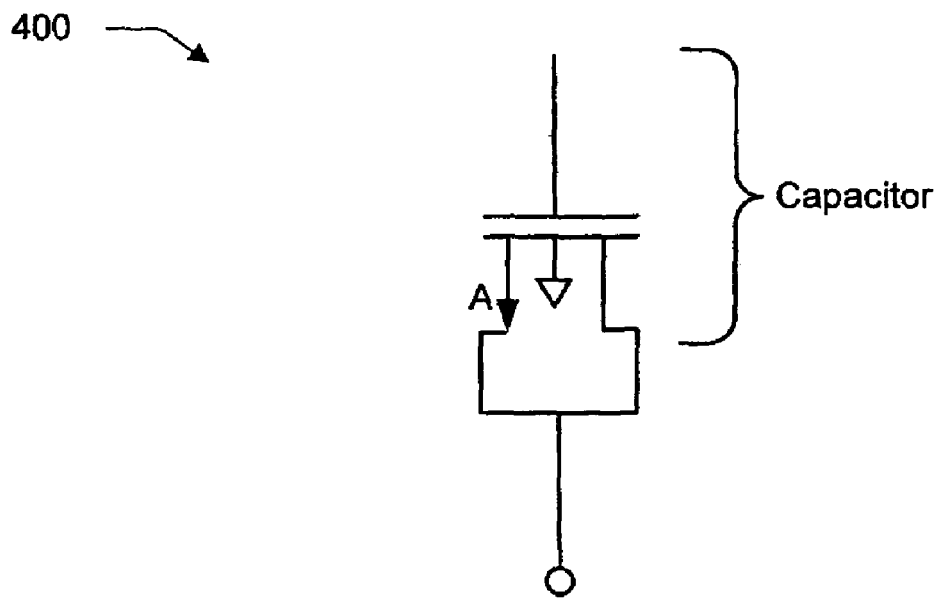
FIG. 4 is an illustration in an exemplary implementation showing the passive gain device of FIG. 2 as a variable capacitor implemented by a Metal-Oxide Semiconductor Field-Effect Transistor (MOSFET).
Figure 5:
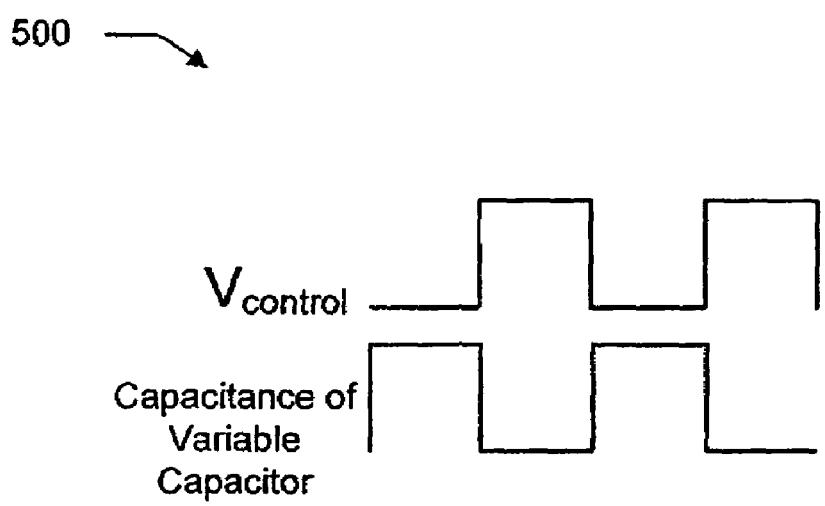
FIG. 5 is a diagram showing timing of voltage and capacitance of the variable capacitor of FIG. 4.

FIG. 4 illustrates an exemplary implementation of the passive gain device 116 of FIG. 2 as a variable capacitor 400 implemented by a Metal-Oxide Semiconductor Field-Effect Transistor (MOSFET). The illustrated MOSFET is a three terminal Metal-Oxide Semiconductor (MOS) capacitor which has different values when Vcontrol is high and low, as illustrated in the diagram 500 FIG. 5. Because the variable capacitor 400 (e.g., the MOSFET) has different values during charge and discharge, gain is produced according to charge conservation as previously described.

Figure 6:
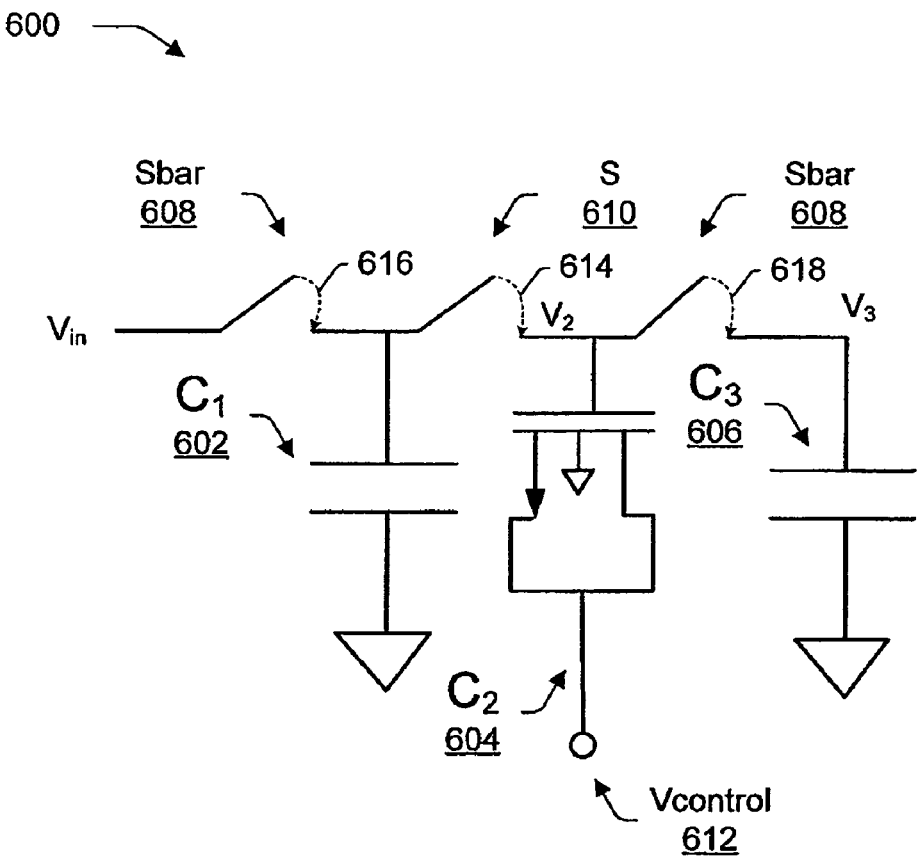
FIG. 6 is an illustration in an exemplary implementation showing a simplified version of the circuit of FIG. 2 as having the variable capacitor of FIG. 4.

FIG. 6 illustrates an exemplary implementation of a circuit 600 depicted as a simplified version of the circuit 200 of FIG. 2 having the variable capacitor 400 of FIG. 4. Capacitor $C_1$ 602 is representative of all the capacitors in the decimation stage 108 of FIG. 2, capacitor $C_2$ 604 is representative of the passive gain device 116 of FIG. 1 and the variable capacitor 400 of FIG. 4, and capacitor $C_3$ 606 is representative of all the capacitors in of the decimation stage 112 of FIG. 2. Switches are disposed between the capacitors, and are labeled as "Sbar" 608 and "S" 610 to denote times, at which, the respective switches are switched on (e.g., equal to "one") or off, e.g., equal to "zero". Likewise, an external voltage "Vcontrol" 612 is illustrated as being utilized to control capacitor $C_2$ 604, i.e., the variable capacitor. The value of the capacitance on $C_2$ 604 is inversely proportional to the voltage "Vcontrol" 612.

When "S" 610 is equal to one (as illustrated by dashed arc 614) and "Vcontrol" 612 is equal to zero, The value of capacitance $C_2$ 604 is large, the following expression holds true:

$$(C_1 + C_2)V_2(n + \tfrac{1}{2}) = C_1 V_{in}(n) + C_2 V_2'(n)$$

The voltage on capacitor $C_2$ 604 is G times smaller than the value on capacitor $C_3$ 606:

$$V_2'(n) = \frac{V_3(n)}{G}$$

When "Sbar" 608 is equal to one (as illustrated by dashed arcs 616, 618) and "Vcontrol" 612 is equal to one, the capacitance of capacitor $C_2$ is G times smaller, the following expression holds true:

$$\left(\frac{C_2}{G} + C_3\right)V_3(n) = C_2 V_2(n - 1/2) + C_3 V_3(n - 1)$$

Solving the above expression yields the following:

$$V_3(z) = \frac{G(1 - \alpha)}{1 - \alpha z^{-1}} V_{in}(z), \text{ where } \delta_1 = \frac{C_2}{C_1 + C_2},$$

$$\delta_2 = \frac{C_2}{C_2 + C_3} \text{ and } \alpha = \frac{G(1 - \delta_2)}{G(1 - \delta_2) + \delta_2(1 - \delta_1)}.$$

It should be noted that pole "$z = \alpha$" moves closer to "$z = 1$", than the case where no parametric change on $C_2$ was applied, corresponding to the case (G=1). This therefore provides a sharper roll-off of a previously decimation stage. This combination therefore achieves a combination of IIR and FIR filtering. The direct current gain is therefore:

$$V_3(1) = G$$

Figure 7:
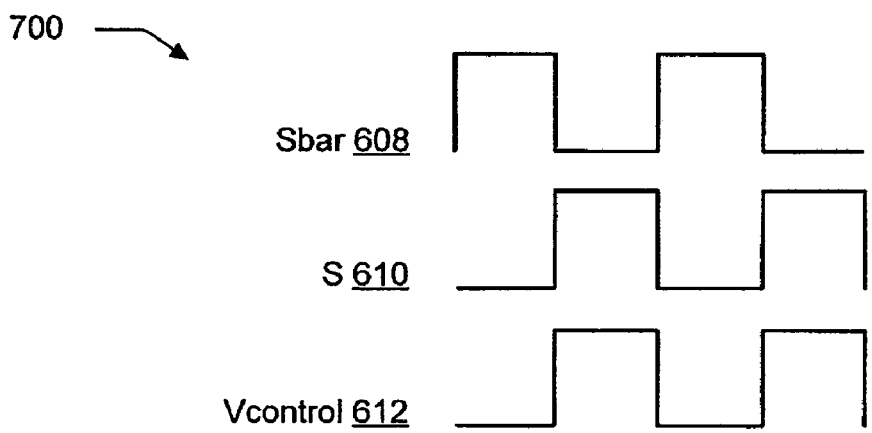
FIG. 7 is an exemplary timing diagram of the circuit of FIG. 6.

As shown in the diagram 700 of FIG. 7, when "Sbar" 608 is high, "S" 610 and "Vcontrol" 612 are low. Likewise, when "Sbar" 608 is low, "S" 610 and "Vcontrol" 612 are high.

Although the variable capacitor $C_2$ 604 is illustrated as a MOSFET in FIG. 6, the variable voltage controlled capacitor may be implemented utilizing a variety of other techniques, (e.g., varactors) to obtain relatively large capacitance changes. For example, a variety of other parametric techniques may be utilized to provide the capacitance change in passive gain device 116 without departing from the spirit and scope thereof.

Figure 8:
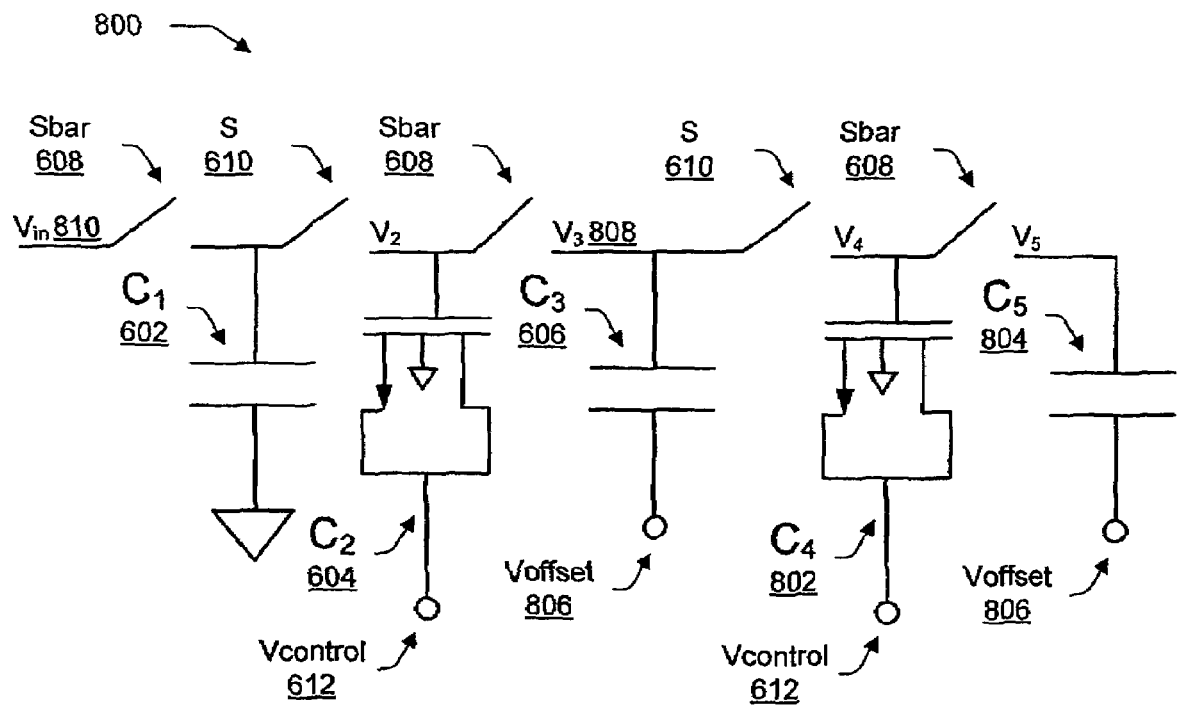
FIG. 8 is an illustration of a circuit in an exemplary implementation that includes the circuit of FIG. 6, which is cascaded with another variable capacitor and yet another decimation stage.
Figure 9:
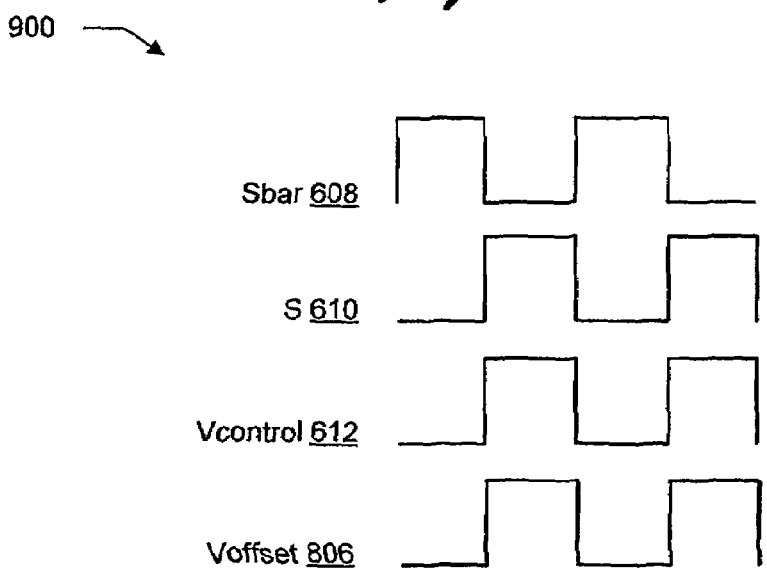
FIG. 9 is an exemplary timing diagram of the circuit of FIG. 8.

FIG. 8 illustrates a circuit 800 in an exemplary implementation which includes the circuit 600 of FIG. 6 as cascaded with another variable capacitor 802 and yet another decimation stage. Like the circuit 600 of FIG. 6, circuit 800 includes capacitor $C_1$ 602 (which is representative of decimation stage 108 of FIG. 2), capacitor $C_2$ 604 (which is representative of the passive gain device 116 of FIG. 1 and the variable capacitor 400 of FIG. 4), and capacitor $C_3$ 606, which is representative of the decimation stage 112 of FIG. 2. Switches are disposed between the capacitors, and are labeled as "Sbar" 608 and "S" 610 to denote times, at which, the respective switches are switched on (e.g., equal to "one") or off, e.g., equal to "zero". Likewise, an external voltage "Vcontrol" 612 is illustrated as being utilized to control capacitor $C_2$ 604, i.e., the variable capacitor.

The circuit 800 is also illustrated as including another capacitor $C_4$ 802 which is representative of another passive gain device and yet another capacitor $C_5$ 804, which is representative the multiple capacitors of yet another decimation stage. Thus, in this example, the filters (e.g., $C_1$ 602, $C_3$ 606, $C_5$ 804) and the passive gain devices (e.g., $C_2$ 604, $C_4$ 802) are cascaded to obtain additional gain without the use of voltage buffers.

To cascade the stages and passive gain devices, an offset voltage obtained due to DC bias voltage is cancelled at each decimation stage (e.g., $C_1$ 602, $C_3$ 606, $C_5$ 804) through use of "Voffset" 806. For example, DC common mode voltage may be subtracted at capacitor $C_3$ 606 and at capacitor $C_5$ 804. The DC voltage developed at node V3 808 is equal to "G" multiplied by "Vin" 810, where "G" is a factor, by which, the capacitor varies. Accordingly, "Voffset" 806 may be set according to the following expression:

$$V\text{offset}=(G-1)*Vin(DC)$$

Thus, the final DC voltage on "V3" 808 during "S" 610 is again "Vin(DC)", which allows the filter to be cascaded again, such that "V5=$G^2$*$V_{in}$,", and so on. Although multiple stages using two passive gain devices have been described, additional passive gain devices and filters may be cascaded to provide increased gain without departing from the spirit and scope thereof.

As previously described, although the passive gain devices (e.g., $C_2$ 604, $C_4$ 802) are illustrated separately from the decimation stages (e.g., $C_1$ 602, $C_3$ 606, $C_5$ 804), the passive gain devices may be incorporated within the decimation stages without departing from the spirit and scope thereof. For example, decimation stage 108 of FIG. 2 may be configured such that at least one of the capacitors which form the decimation stage is configured as a variable capacitor to increase gain. Likewise, decimation stage 112 may also be configured to include a variable capacitor that may provide cascaded gain in conjunction with decimation stage 108. It should be noted that gain and pole location may be changed by changing "G", i.e., the factor by which a variable capacitor is varied. For instance, the pole location may be changed by chancing a value of $C_1$ 602 and/or a number of capacitors.

This scheme may be applied to a variety of devices. For example, the scheme may be used by a mixer. If "G" is a varying function of time that has a form, for instance, of "G=G0*sin(2*pi*fmix*t)", then the output of the filter would be a product of the signal frequency and "fmix". This scheme may also be used for "Variable Gain Amplification". By changing the factor "G" by controlling the voltage change on Vcontrol, for instance, the capacitance change observed on the parametric device can be controlled to provide a variable gain amplifier. Variable gain amplifiers have a variety of uses, such as to provide an increased dynamic range of a radio.

EXEMPLARY PROCEDURES

The following discussion describes filter gain techniques that may be implemented utilizing the previously described systems and devices. Aspects of each of the procedures may be implemented in hardware, firmware, or software, or a combination thereof. The procedures are shown as a set of blocks that specify operations performed by one or more devices and are not necessarily limited to the orders shown for performing the operations by the respective blocks.

Figure 10:
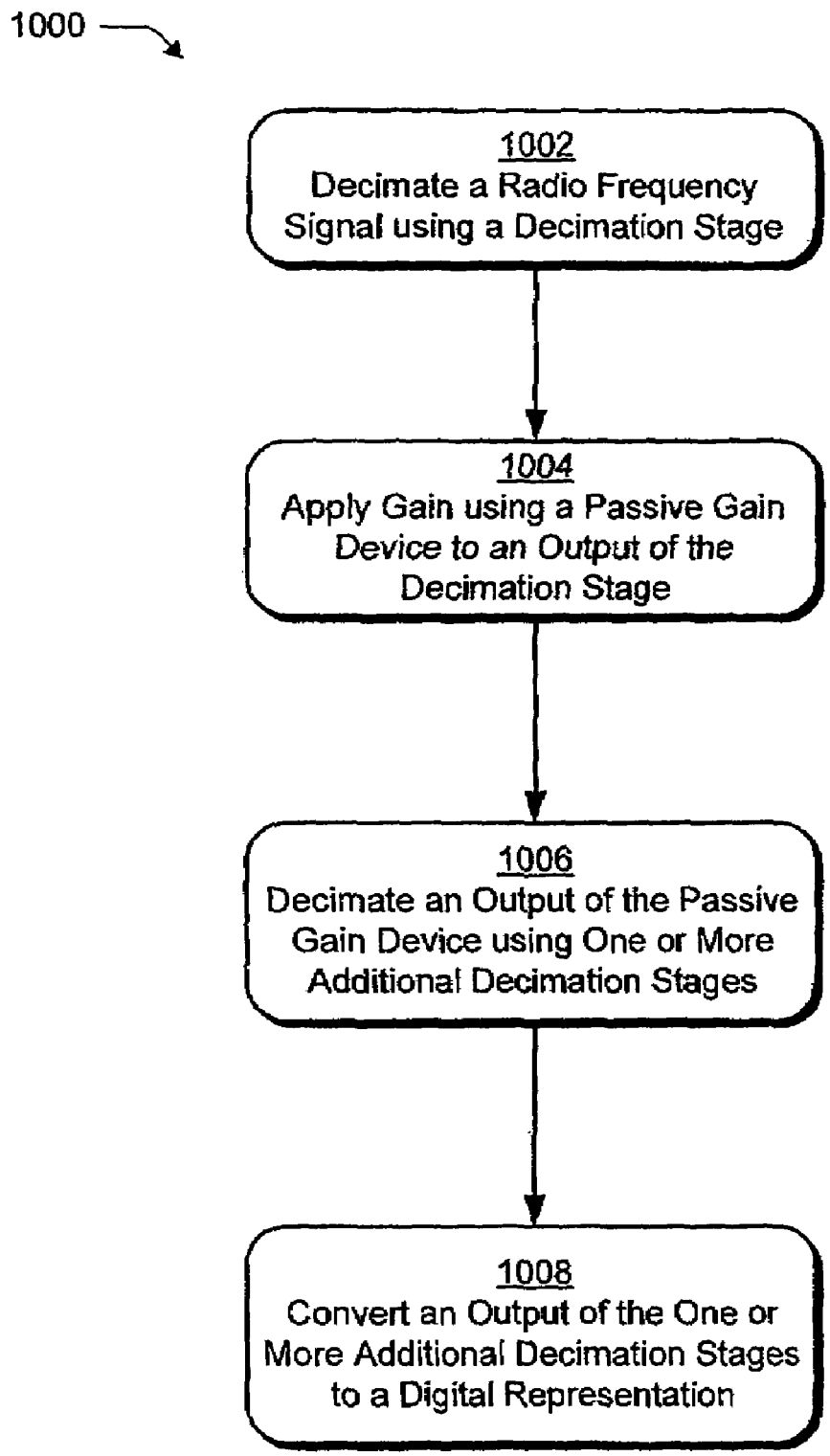
FIG. 10 is a flow diagram depicting a procedure in an exemplary implementation in which a radio frequency signal is decimated by a decimation filter and gain is applied by a passive gain device.

FIG. 10 is a flow diagram depicting a procedure 1000 in an exemplary implementation in which a radio frequency signal is decimated by a decimation filter and gain is applied by a passive gain device. A radio frequency (RF) signal is decimated using a decimation stage (block 1002). For example, the RF signal may be received by a radio having a sampled data receiver which is configured to translate and amplify the RF signal to discrete voltage steps, followed by digital to analog conversion. To avoid noise aliasing during the decimation process, the decimation stage may employ one or more discrete time (DT) filters, which can be FIR/IIR type, an example of which is illustrated in FIG. 2.

Gain is applied using a passive gain device to an output of the decimation stage (block 1004). For instance, the passive gain device 116 may utilize a parametric amplifier approach, such as a variable capacitor, to provide gain to the output of the decimation stage through use of a clock.

An output of the passive gain device is decimated using one or more additional decimation stages (block 1006). For example, the one or more additional decimation stages may be configured to cascade gain to the signal to provide further gain and filtering, further discussion of which may be found in relation to FIG. 11.

An output of the one or more additional decimation stages is converted to a digital representation, i.e., from a analog signal to an digital signal (block 1008). An A/D converter, for instance, may be utilized to convert the signal to a digital signal.

Figure 11:
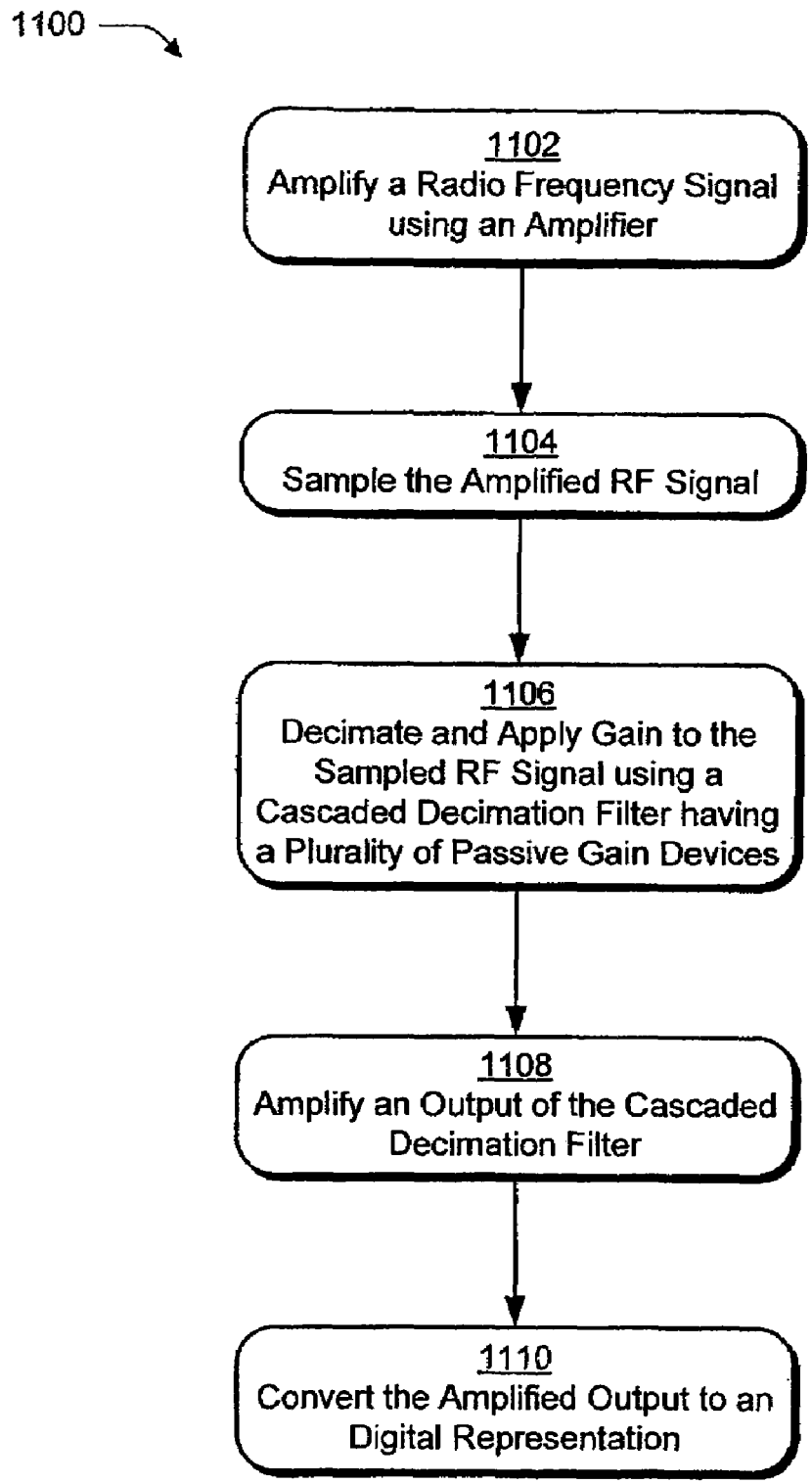
FIG. 11 is a flow diagram depicting a procedure in an exemplary implementation in which gain is applied to a radio frequency signal by cascading a plurality of decimation stages and passive gain devices.

FIG. 11 is a flow diagram depicting a procedure 1100 in an exemplary implementation in which gain is applied to a radio frequency signal by cascading a plurality of decimation stages and passive gain devices. A radio frequency (RF) signal is amplified using an amplifier (block 1102). For example, an RF input may be received by the LNA 104 of FIG. 1 and amplified.

The amplified RF signal is then sampled (block 1104). For example, the sampler and mixer 106 may be utilized to sample an output of the LNA 104. The sampled RF signal is decimated and gain is applied using a cascaded decimation filter having a plurality of passive gain devices (block 1106). For instance, the circuit 800 of FIG. 8 includes a plurality of passive gain devices (e.g., $C_2$ 604 and $C_4$ 802) and a plurality of decimation stages (e.g., $C_1$ 602, $C_3$ 606, $C_5$ 804) which are arranged such that a signal, which passing through these components, is provided with increasing amounts of gain and decimated in a plurality of steps. An offset voltage (e.g., "Voffset" 806) may be applied to cancel DC bias voltage at one or more of the decimation stages.

An output of the cascaded decimation filter is amplified (block 1108) and converted to an digital signal (block 1110). For example, an output from the decimation stages 108, 112 and passive gain device 116 may be provided to the amplifier 118 to be amplified, a result of which is then provided to an analog/digital converter 120.

CONCLUSION

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. A decimation filter comprising a plurality of decimation stages and passive gain devices that are cascaded to provide gain to a radio frequency (RF) signal, wherein at least one said decimation stage is configured to cancel offset voltage obtained due to direct current induced bias voltage.

2. A decimation filter as described in claim 1, wherein at least one said passive gain device is configured to function as a voltage controlled capacitor.

3. A decimation filter as described in claim 2, wherein the at least one said passive gain device is a Metal-Oxide Semiconductor Field-Effect Transistor (MOSFET) that provides the passive gain due to charge conservation.

4. A decimation filter as described in claim 1, wherein the gain is provided without use of a voltage buffer.

5. A decimation filter as described in claim 1, wherein the gain is provided through a parametric amplifier approach to provide the passive gain.

6. A decimation filter as described in claim 1, wherein the offset voltage is cancelled by subtracting common mode voltage by the at least one said decimation stage.

7. A radio comprising:
an amplifier configured to amplify a radio frequency (RF) input;
a sampler configured to sample the amplified RF input;
a decimation filter having a passive gain device configured to decimate the amplified RF input and provide gain, wherein the decimation filter includes a plurality of decimation stages and a plurality of said passive gain devices that are cascaded to decimate the amplified RF input and provide gain; and
an analog/digital converter configured to translate an output of the decimation filter.

8. A radio as described in claim 7, wherein:
the decimation filter includes a plurality of decimation stages; and
the passive gain device is positioned between at least two said decimation stages.

9. A radio as described in claim 8, wherein the passive gain device is configured to function as a voltage controlled capacitor.

10. An apparatus having the radio as described in claim 7, wherein the apparatus is configured as a phone or a computer.

11. A method comprising:
decimating a radio frequency (RF) signal utilizing at least one decimation stage of a decimation filter;
applying gain to the decimated RF signal using a passive gain device;
decimating the applied RF signal utilizing another decimation stage; and
applying gain to the RF signal decimated by the other decimation stage using another passive gain device; and
canceling offset voltage of the other decimation stage by subtracting common mode voltage at the other decimation stage.

12. A method as described in claim 11, wherein the passive gain device is implemented as a variable capacitor that is configured to provide the gain using charge conservation.

13. A method as described in claim 11, wherein the decimating and the applying are performed by a sampled data radio.

14. A method as described in claim 11, wherein the at least one decimation stage is implemented by a plurality of capacitors that are configured to have coordinated operation through use of a clock.

15. A method as described in claim 11, wherein the at least one decimation stage is implemented using a discrete time filter.

16. A method as described in claim 11, further comprising translating the applied RF signal using an analog/digital converter.

17. A method as described in claim 11, wherein the at least one decimation stage is passive.

* * * * *